United States Patent [19]

Zanzucchi

[11] Patent Number: 4,587,487

[45] Date of Patent: May 6, 1986

[54] OPTICAL FIBER MAGNETOMETER FOR MEASURING D.C. AND LOW FREQUENCY FIELDS

[75] Inventor: Paul Zanzucchi, Cleveland, Ohio

[73] Assignee: Gould Inc., Rolling Meadows, Ill.

[21] Appl. No.: 474,148

[22] Filed: Mar. 10, 1983

Related U.S. Application Data

[63] Continuation-in-part of Ser. No. 443,303, Nov. 22, 1982, abandoned.

[51] Int. Cl.$^4$ .......................... G01R 33/02; G02F 1/09
[52] U.S. Cl. ...................................... 324/244; 350/376
[58] Field of Search .................. 324/244, 96, 117 R, 324/262, 260; 350/376, 375, 374; 455/610, 611, 612; 332/7.51

[56] References Cited

U.S. PATENT DOCUMENTS

| | | |
|---|---|---|
| 3,778,619 | 12/1973 | Carnel .................................. 324/96 |
| 4,112,367 | 9/1978 | Hepner et al. . |
| 4,147,979 | 4/1979 | Baues et al. . |
| 4,268,116 | 5/1981 | Schmadel et al. . |
| 4,319,186 | 3/1982 | Kingsley . |
| 4,433,291 | 2/1984 | Yariu et al. .......................... 324/244 |

OTHER PUBLICATIONS

Article, "Optical Fiber Magnetic Field Sensors", Dandridge et al; *Electronics Letters*, 5/22/80, vol. 16, No. 11, p. 408.

*Primary Examiner*—Ernest F. Karlsen
*Assistant Examiner*—Walter E. Snow
*Attorney, Agent, or Firm*—Jenner & Block

[57] ABSTRACT

An optical fiber magnetometer employing balanced magnetostrictive oscillations to measure D.C. and low frequency ambient magnetic fields. The magnetometer includes an optical fiber interferometer 18 having a laser beam input 10 for travel through first and second arms 14, 16 of the interferometer. First and second magnetostrictive rods 20, 22 forming a matched pair are coupled to the respective optical fibers in the first and second interferometer arms 14, 16. An applied oscillating magnetic field is applied to each of the rods 180° out of phase. The D.C. or low frequency magnetic field to be measured, when combined with each of the applied fields, induces a change in the path length of each of the interferometer arms. The difference in the change in path length of each of the interferometer arms is determined to develop a signal representative of the D.C. to low frequency ambient magnetic field.

26 Claims, 10 Drawing Figures

FIG. 1
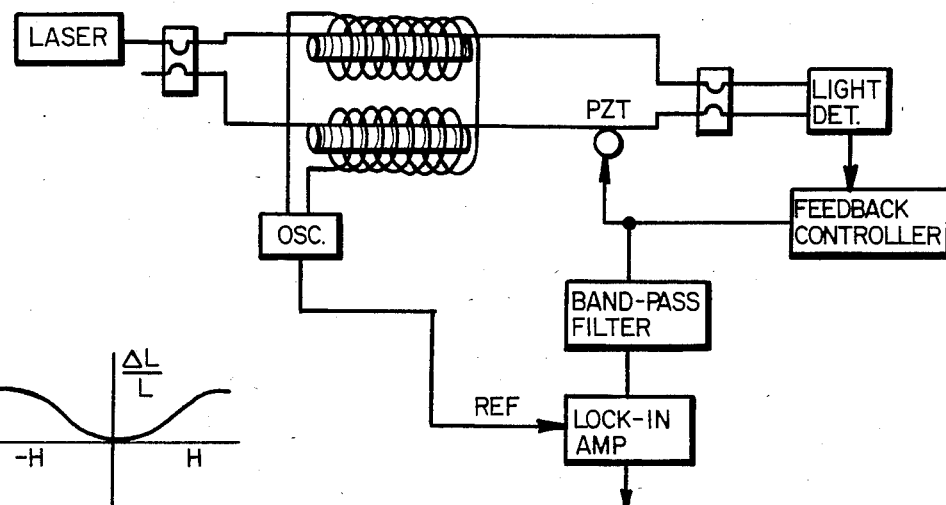
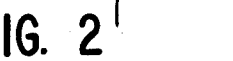
FIG. 2
FIG. 3
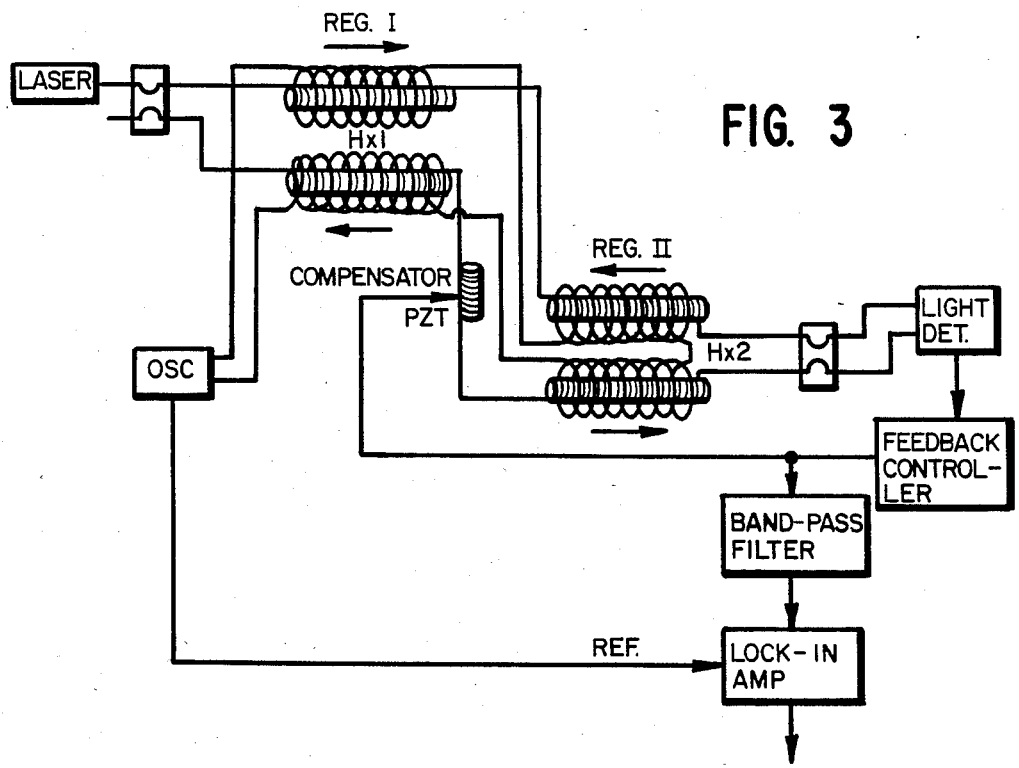

OPTICAL FIBER MAGNETOMETER FOR MEASURING D.C. AND LOW FREQUENCY FIELDS

BACKGROUND OF THE INVENTION

This application is a continuation in part of application Ser. No. 443,303 filed Nov. 22, 1982, now abandoned.

FIELD OF THE INVENTION

This invention relates to a magnetometer and in particular an optical fiber magnetometer for measuring D.C. and low frequency magnetic fields.

DESCRIPTION OF THE PRIOR ART

Optical fiber magnetometers have been known for measuring A.C. magnetic fields. One such magnetometer as described in *Electronics Letters*, May 22, 1980, Vol. 16, No. 11 p. 408, includes an optical fiber interferometer having a laser beam input for travel through first and second arms of the interferometer. The optical fiber in the first arm includes a magnetostrictive jacket to which a bias magnetic field is applied for modulating the path length of the first interferometer arm. Detection of the A.C. magnetic field is accomplished by phase tracking techniques.

Although such optical fiber magnetometers adequately detect high frequency A.C. magnetic fields, the detection of D.C. and low frequency magnetic fields has been prevented due to thermal fluctuations along the optical fibers producing a noise floor which increases with lower frequencies of observation.

SUMMARY OF THE INVENTION

The present invention is directed to an optical fiber magnetometer employing balanced magnetostrictive oscillations to measure D.C. and low frequency ambient magnetic fields.

The magnetometer includes an optical fiber interferometer having a laser beam input coupled to first and second arms of the interferometer. First and second magnetostrictive rods are coupled to the respective optical fibers in the first and second interferometer arms. An oscillating magnetic field is applied to each of the rods 180° out of phase. The D.C. or low frequency ambient magnetic field to be measured provides an offset which, when combined with each of the applied fields, induces a change in the oscillating path length of each of the interferometer arms. The difference in the change in the oscillating path length of each of the interferometer arms is determined to develop a signal representative of the low frequency ambient magnetic field.

Means are further provided to reduce or eliminate any unbalance terms from the output signal so that the intensity of the signal is proportional to the low frequency ambient magnetic field.

The optical fiber magnetometer may also include a sample and hold feedback controller which samples the output of the magnetometer at a selected point to derive a voltage which is applied to a piezoelectric transducer compensator disposed in one arm of the magnetometer in order to compensate for temperature drift.

Further, the optical fiber magnetometer may include a second pair of magnetostrictive rods to form a gradiometer. The first pair of rods is responsive to a low frequency magnetic field in a first region and the second pair of rods is responsive to a low frequency magnetic field in a second region, the output of the gradiometer being a signal whose intensity is proportional to the difference between the magnetic fields in the first and second regions.

BRIEF DESCRIPTION OF THE DRAWING

Other features and advantages of the invention will be apparent from the following description taken in connection with the accompanying drawing wherein:

FIG. 1 is a block diagram of the optical fiber magnetometer of the present invention;

FIG. 2 is a graph of a magnetostrictive curve; and

FIG. 3 is a block diagram of a gradiometer;

DESCRIPTION OF THE PREFERRED EMBODIMENT

Figure 4:
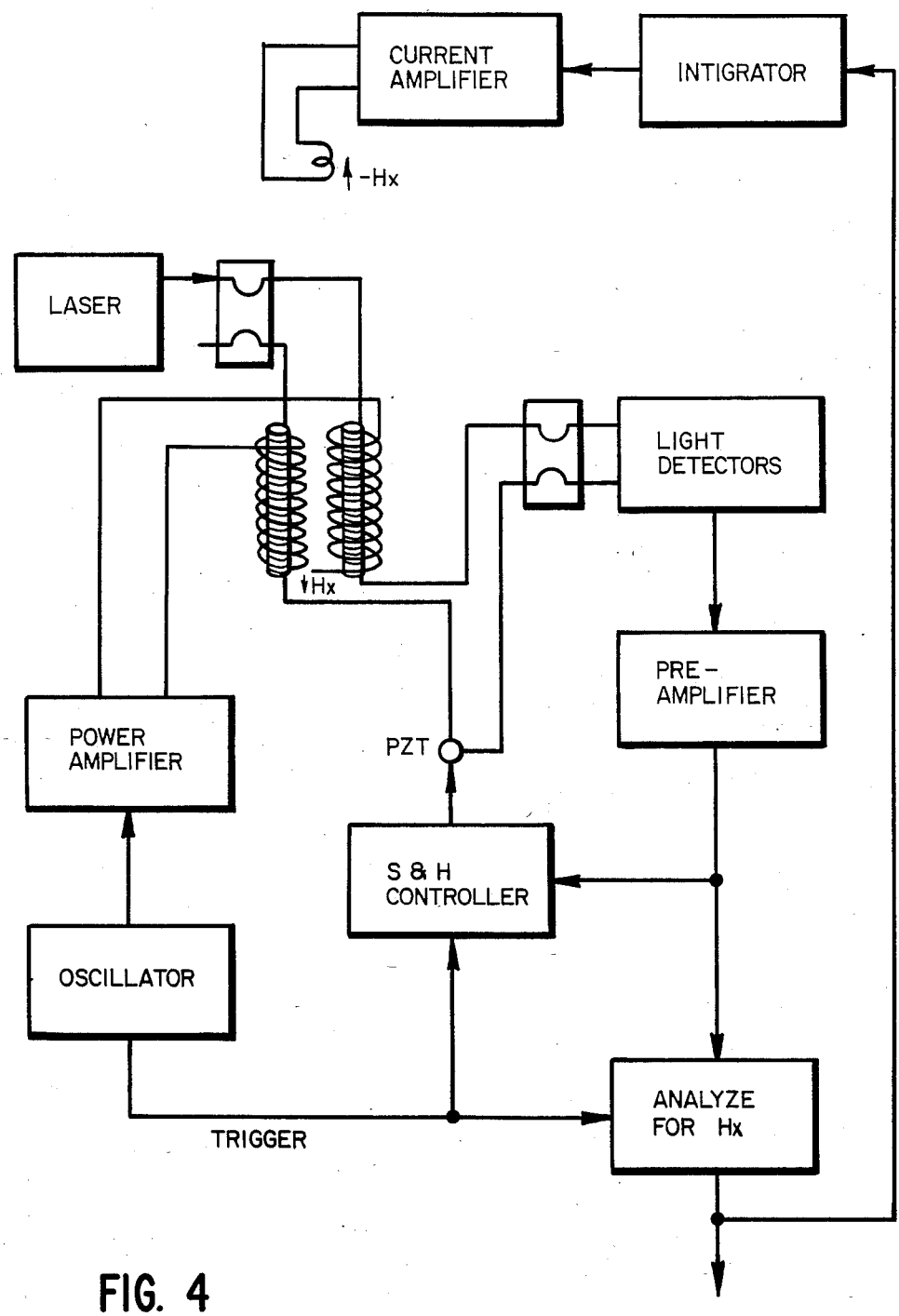
FIG. 4 is a block diagram of the optical fiber magnetometer employing a sample and hold feedback controller.

The optical fiber magnetometer as shown in FIG. 1 employs balanced magnetostrictive oscillations to measure low frequency magnetic fields which are outside the detector, i.e. ambient, in the range of D.C.(steady field) to 10 Hz. The magnetometer has a laser beam input 10 which is split by a bottle coupler 12 into first and second arms 14 and 16 of an optical fiber interferometer generally designated 18. The optical fibers in each arm 14 and 16 are attached to respective rods 20 and 22 made of a magnetostrictive material such as nickel, the rods being matched to provide a balanced system. The ends of the optical fibers of each arm are coupled to a second bottle coupler 24, the light beam outputs from each being applied to light detector means 26.

The magnetostrictive rods 20 and 22 are driven in opposition by an oscillator 28, the driving frequency of which may be 200–400 Hz. The oscillator is coupled to coils 30 and 32 wound in opposite directions about the respective rods 20 and 22 so that the rods are driven 180° out of phase. The oscillator coils apply respective oscillating magnetic fields, $H_0\cos(\omega t)$ and $H_0\cos(\omega t + 180°)$, to the rods 20 and 22 wherein $H_0$ is the magnitude of the bias magnetic field and $\cos(\omega t)$ is the waveform generated by the oscillator 28. The applied oscillating fields and the D.C. or low frequency field to be measured, $H_X$, cause strains in the rods which are transferred to the optical fibers resulting in a change in the amplitude of the oscillation of the optical path length of each of the interferometer arms 14 and 16.

The two light beams output from the respective arms 14 and 16 of the interferometer form a fringe or interference pattern on the light detector means 26, which may comprise a pair of light sensors, each of which receives the interferometric signal, with two being used and connected as is conventional to provide a greater signal to noise ratio. The light detector converts the interference pattern into an electrical signal which is amplified to develop a voltage representing $\Delta L_{out}$, the difference in the change in length between the two arms of the interferometer.

$\Delta L_{out}$ is defined as follows:

$$\Delta L_{out} = \Delta L_c - \Delta L_k \quad 1$$

where $\Delta L_C$ and $\Delta L_K$ are the respective changes in path length of the first arm 14 and second arm 16 of the interferometer, "C" and "K" denoting the respective coupling constants of the rods.

The change in the optical path length of each of the interferometer arms varies as a function of the applied magnetic field as seen from the magnetostrictive curve shown in FIG. 2 where $\Delta L/L$ is the change in length per unit length of optical fiber. The magnetostrictive curve, on first approximation, can be assumed to be an even function so that the change in length per unit length, $\Delta L/L$, of the interferometer arms 14 and 16 may be expressed as a function of the applied magnetic field as follows:

$$\frac{\Delta L}{L_c} = \sum_{n=1}^{\infty} C_{2n} H_c^{2n} \quad 2$$

and $$\frac{\Delta L}{L_k} = \sum_{n=1}^{\infty} K_{2n} H_k^{2n}; \quad 3$$

where $H_c$ is the magnetic field applied to the rod 20, $H_k$ is the magnetic field applied to the rod 22 and $L_c$ and $L_k$ are the lengths of optical fiber wound about respective rods 20 and 22. Assuming that the first term in each of the above series dominates, the change in length of the respective interferometer arms 14 and 16 may be written as $$\Delta L_c \approx C_2 L_c H_c^2 \quad 4$$

and $$\Delta L_k \approx K_2 L_k H_k^2 \quad 5$$

The weak unknown magnetic field $H_x$ provides an offset which is added to the bias field applied to the respective rods so that $$H_c = H_x + H_o \cos(\omega t) \quad 6$$

and $$H_k = H_x + H_o \cos(\omega t + 180°) = H_x - H_o \cos(\omega t) \quad 7$$

$\Delta L_{out}$ can now be expressed as $$\begin{aligned}\Delta L_{out} &= C_2 L_c H_c^2 - K_2 L_k H_k^2 \\ &= C_2 L_c (H_x + H_o \cos(\omega t))^2 - K_2 L_c (H_x - H_o \cos(\omega t))^2 \\ &= 2(C_2 L_c + K_2 L_k) H_x H_o \cos(\omega t) + \\ &\quad \tfrac{1}{2} H_o^2 (C_2 L_c - K_2 L_k) \cos(2\omega t) + \\ &\quad (H_x^2 + \tfrac{1}{2} H_o^2)(C_2 L_c - K_2 L_k).\end{aligned} \quad 8$$

From equation 8 it is seen that the output signal from the light detector representing $\Delta L_{out}$ includes a first harmonic term $2(C_2 L_c + K_2 L_k) H_x H_o \cos(\omega t)$ whose intensity is proportional to the unknown field $H_x$, a second harmonic term $\tfrac{1}{2} H_o^2 (C_2 L_c - K_2 L_k) \cos(2\omega t)$ and a DC term $(H_x^2 + \tfrac{1}{2} H_o^2)(C_2 L_c - K_2 L_k)$. The second harmonic and DC terms are both proportional to the unbalance, $(C_2 L_c - K_2 L_k)$ of the magnetometer. If the system is perfectly balanced such that the coupling constants C and K of the rods are equal and the respective lengths of optical fiber $L_c$ and $L_k$ are equal, the unbalance terms will be eliminated from the output signal, leaving only the first harmonic term proportional to the unknown ambient magnetic field $H_x$. Since a perfectly balanced system can typically exist only in theory, means are provided to eliminate or to reduce to an acceptable level the unbalanced terms as much as possible by trim controls as discussed below.

Trim controls which adjust the system to achieve a better "effective" balance, that is, by reducing the second harmonic (see equation 8), can be accomplished as follows:

(1) The applied oscillation "$H_o$" on each detector rod can be of different amplitude.

(2) A fixed bias current can be added on top of the applied oscillation in only one coil and/or another fixed bias current (not the same) applied into the other coil.

(3) Trim magnetics or trim coils with a fixed value or current that can be added on top of the fields produced by the drive coils, and/or (4) Stain can be applied to one and/or both rods to change its magnetostriction curve.

The output signal from the light detector 26 representing $\Delta L_{out}$ is in terms of the light in the interference pattern formed and is expressed in angular units of radians, $2\pi$ radians being equal to one wavelength, $\lambda$, of laser light. Since the dynamic range of $\Delta L_{out}$ is typically larger than 2 radians, the output signal from the light detector is nonlinear and approximately equal to $\cos(\Delta L_{out} 2\pi/\lambda)$.

To linearize the output of the light detector 26, a continuous null feedback controller 34 and a PZT compensator 36 are employed. The continuous null feedback controller 34 may be as described in *Review of Scientific Instruments*, Vol. 52, p. 996, July 1981. The PZT compensator 36 includes a piezoelectric transducer having the optical fiber in the second arm 16 of the interferometer wound thereabout. The PZT compensator 36, in response to total feedback from the controller 34, changes the path length of the second arm 16 to maintain the interferometer arms balanced. The compensator 36 nulls low frequency fluctuations which arise from temperature changes so that the interferometer is operated at quadrature at which the light detector 26 is the most sensitive. By using total feedback to the PZT compensator 36, a voltage signal which is linear in $\Delta L_{out}$ is provided on line 38.

The voltage, $\Delta L_{out}$, from the feedback controller 34 on line 38 as described above includes a first harmonic term whose intensity is proportional to the unknown magnetic field $H_x$ and a second harmonic and DC term which are proportional to the unbalance of the magnetometer. The $L_{out}$ signal on line 38 may also include a low frequency term resulting from changes in the optical path lengths due to temperature changes. The low frequency components are eliminated by a bandpass filter 40 to which the $\Delta L_{out}$ signal on line 38 is applied. The output of the band pass filter 40 is applied to a lock-in amplifier 42 which is both frequency and phase locked by a reference signal, $\cos(\omega t)$, applied from the oscillator 28. The lock-in amplifier thus passes only the first harmonic of the $\Delta L_{out}$ signal which is proportional to the unknown ambient magnetic field $H_x$ and eliminates the unbalance terms.

In constructing the optical fiber magnetometer shown in FIG. 1, it has been found that the greater the length of optical fiber wound about the rods 20 and 22, the greater the sensitivity of the magnetometer. A length of 4 meters has been used. With 30 meters of optical fiber wound about each rod, a practical calculated limit of sensitivity for the magnetometer is on the order of $10^{-9}$ Gauss at $10^{-4}$ radian sensitivity which has been found to be three orders of magnitude greater than the sensitivity of commercial electrical fluxgate magnetometers presently used to measure DC magnetic fields. Each of the rods 20 and 22 may be 4 inches in length. Where the optical fibers are wound about the circumference of the rods, the diameter of the rods should be approximately 1 inch. However, where the optical fibers are coupled to the rods in a different configuration such as if the fibers are secured lengthwise to the rods instead of about the entire circumference thereof, the diameter of the rods may be reduced such as to ½ inch. The center of each of the rods 20 and 22 is drilled out to cut down on eddy current losses. Making the rods hollow with a thin wall also results in greater changes in the radius of each of the rods and thus greater changes in the optical path length of each of the interferometer arms so that the magnetometer is more sensitive than if solid rods were employed.

Although the rods have been described as being made of nickel, other magnetostrictive materials such as metallic glasses and rare earth materials having higher magnetostrictive elongation constants may be employed. Further, periodic wave forms other than the cosine waveform generated by the oscillator 28, may be used for driving the rods so as to increase the sensitivity of the output signal to the unknown magnetic field $H_x$.

The magnetometer of FIG. 1 may be modified by adding a second pair of matched magnetostrictive rods 44 and 46 in the optical fiber interferometer to form a gradiometer as shown in FIG. 3. The gradiometer measures the gradient of a magnetic field such as the change in the earth's magnetic field over a distance. The magnetostrictive rods 20 and 22 are responsive to the unknown magnetic field $H_{x1}$ in a region I whereas the magnetostrictive rods 44 and 46 are responsive to the unknown magnetic field, $H_{x2}$, in a region II.

The oscillator 28 is coupled to coils 48 and 50 wound in opposite directions about respective rods 44 and 46 so that the rods are driven 180° out of phase with respect to each other. The coils 48 and 50 are also wound such that rod 44 is driven 180° out of phase with rod 20 and rod 46 is driven 180° out of phase with rod 22. Therefore, the magnetic fields applied to each of the rods may be expressed as follows:

$$H_{c1} = H_{x1} + H_0\cos(\omega t)$$
$$H_{c2} = H_{x1} - H_0\cos(\omega t)$$
$$H_{k1} = H_{x2} - H_0\cos(\omega t)$$
and
$$H_{k2} = H_{x2} + H_0\cos(\omega t)$$

wherein $H_{c1}$, $H_{c2}$, $H_{k1}$ and $H_{k2}$ are the magnetic fields applied to rods 20, 44, 22 and 46 respectively.

The light detector 26 determines the difference $L_{out}$ in the change in path length of each arm 14 and 16 of the interferometer as described above. However, because the rods 20 and 44 are connected in series in the interferometer arm 14, the change in lengths due to the applied magnetic fields $H_{c1}$ and $H_{c2}$ add together. Similarly the change in lengths due to the applied magnetic fields $H_{k1}$ and $H_{k2}$ add together. $\Delta L_{out}$ is expressed as follows:

$$\Delta L_{out} = (\Delta L_{c1} + \Delta L_{c2}) - (\Delta L_{k1} + \Delta L_{k2}) \quad\quad 10$$
$$= (\Delta L_{c1} - \Delta L_{k1}) - (\Delta L_{k2} - \Delta L_{c2})$$

For simplicity, if the coupling constants of each of the rods are assumed to be equal to C and the length of optical fiber wound about each rod is assumed to be one, then, according to equations 8 and 9, equation 10 may be rewritten as $$\Delta L_{out} = 4CH_{x1}H_0\cos(\omega t) - 4CH_{x2}H_0\cos(\omega t) \quad\quad 11$$
$$= 4C(H_{x1} - H_{x2})H_0\cos(\omega t)$$

From equation 11 it is seen that the output $L_{out}$ of the optical fiber gradiometer includes a first harmonic term whose intensity is proportional to the difference between the unknown magnetic fields $H_{x1}$ and $H_{x2}$ of regions I and II. Although the above analysis assumed a perfectly balanced system, the gradiometer includes the bandpass filter 40 to eliminate low frequency components from the output signal and the lock-in amplifier 42 to eliminate any unbalance terms as described with reference to FIG. 1.

It is noted that in the optical fiber gradiometer of FIG. 2, the comparison of the unknown magnetic fields and the cancellation of unwanted terms is accomplished by the optical fiber interferometer itself. No additional fiber circuitry (except the trim controls discussed earlier) is required to perform the comparison operation as is typically required by known gradiometers which employ two magnetometers, the output signals of which must be compared electrically to determine the gradient.

Another embodiment of the optical fiber magnetometer is shown in FIG. 4 with the continuous null feedback controller 34 replaced by a sample and hold feedback controller 52 to better compensate for drift in the magnetometer output due to random temperature fluctuations. The sample and hold feedback controller 52 modifies the output of the magnetometer, taken at the output of a pre-amplifier 56 connected to the light detectors 26, such that it is given by:

$$V_{out}(\omega t) = V_0 \cos\left[ 2\pi \frac{L(\omega t)}{\lambda} + L\alpha(\text{temp}) \right] \quad\quad 12$$

Where $L\alpha(\text{temp})$ is the change in path length due to random temperature fluctuations and $L(\omega t)$, the change in path length due to the bias and ambient magnetic fields is given by the following simplified version of equation 8:

$$L_{out}(\omega t) = 4CLH_xH_0\cos(\omega t)$$
$$+ \tfrac{1}{2} DCLH_0^2\cos(2\omega t) \quad\quad 13$$

D representing the percent of detector rod balance.

Figure 5A:
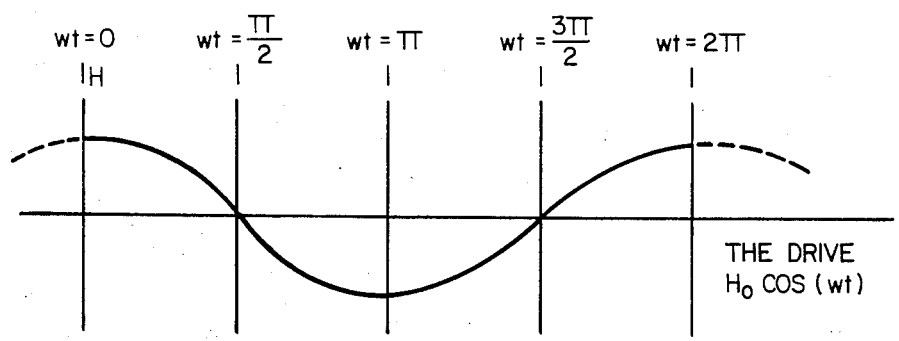
FIG. 5A is a graph of the applied oscillating magnetic field or drive.
Figure 5B:
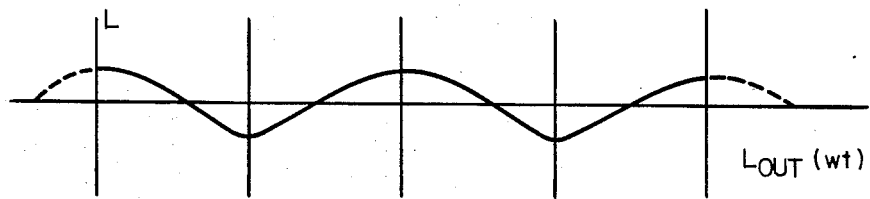
FIG. 5B is a graph illustrating a length change signal produced by the magnetostrictive rods.
Figure 5C:
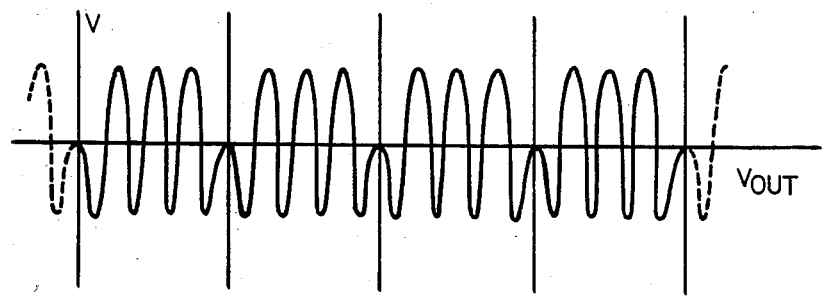
FIG. 5C is a graph of the output of the optical fiber magnetometer of FIG. 4.

With reference to FIG. 5B, illustrating $L_{out}(\omega t)$ with the second harmonic thereof being the dominant term, it has been found that at the turning points, those points for which the time derivative of $L(\omega t)$ is zero, i.e., at $t=0, \pi/2, \pi, 3\pi/2 \ldots$, $L_{out}(\omega t)$ drifts with random temperature fluctuations. The sample and hold feedback controller compensates for temperature fluctuations by holding the output of the magnetometer, $V_{out}(\omega t)$, to a relative zero at the turning points of $L_{out}(\omega t)$ in the absence of the ambient magnetic field.

As seen with reference to FIGS. 5A and 5B, the turning points in the drive, $H_o\cos(\omega t)$ at each quarter cycle $\omega t = \pi/2$ are also turning points in the change in length signal $L_{out}(\omega t)$. The drive, $H_o\cos(\omega t)$ is the oscillating magnetic field applied to rod 20 from the oscillator 28 through a power amplifier 53, the oscillator 28 also providing a square wave trigger signal, having the same frequency as the drive. The sample and hold feedback controller 52 is responsive to the trigger signal applied thereto on line 54 to sample the output of the magnetometer at the pre-amplifier 56 at a selected turning point of $L_{out}(\omega t)$. For the selected turning point at $\omega t=0$, the controller 52 measures $V_{out}(0)$ and adjusts the voltage applied to the PZT compensator 36 to hold $L\alpha$ (temp) to a fixed value of $\pi/2$ so that at the sampled turning point, $V_{out}(0)=0$.

In order that the output $V_{out}(\omega t)$ is held at a relative zero at the remaining turning points $\omega t = \pi/2, \pi, 3\pi/2$..., in the absence of the ambient magnetic field $H_x$, the magnitude of the applied bias magnetic field $H_o$ is adjusted so that at each quarter cycle, $\Delta \omega t = \pi/2$ $$\Delta L(\omega t) = L(\omega t) - L(\omega t + \pi/2) = \lambda n/2 \qquad 14$$

When so adjusted, the magnetometer, at the turning points $\omega t=\pi/2, \pi, 3\pi/2\ldots$, will be in a quadrature condition wherein a change in the external magnetic field produces a greater change at these points in the output $V_{out}(\omega t)$ which is given by $$V_{out}(\omega t) = V_o \cos\left(2\pi \frac{L(\omega t)}{\lambda} + \pi/2\right) \qquad 15$$

The output of the magnetometer at $\omega t=0$ will be held at zero due to the sample and hold feedback controller. However, at $\omega t=\pi/2, \pi, 3\pi/2\ldots$, the output will vary with the unknown ambient magnetic field $H_x$ and may be analyzed for $H_x$ by various techniques at block 57 as described below in greater detail.

Figure 6:
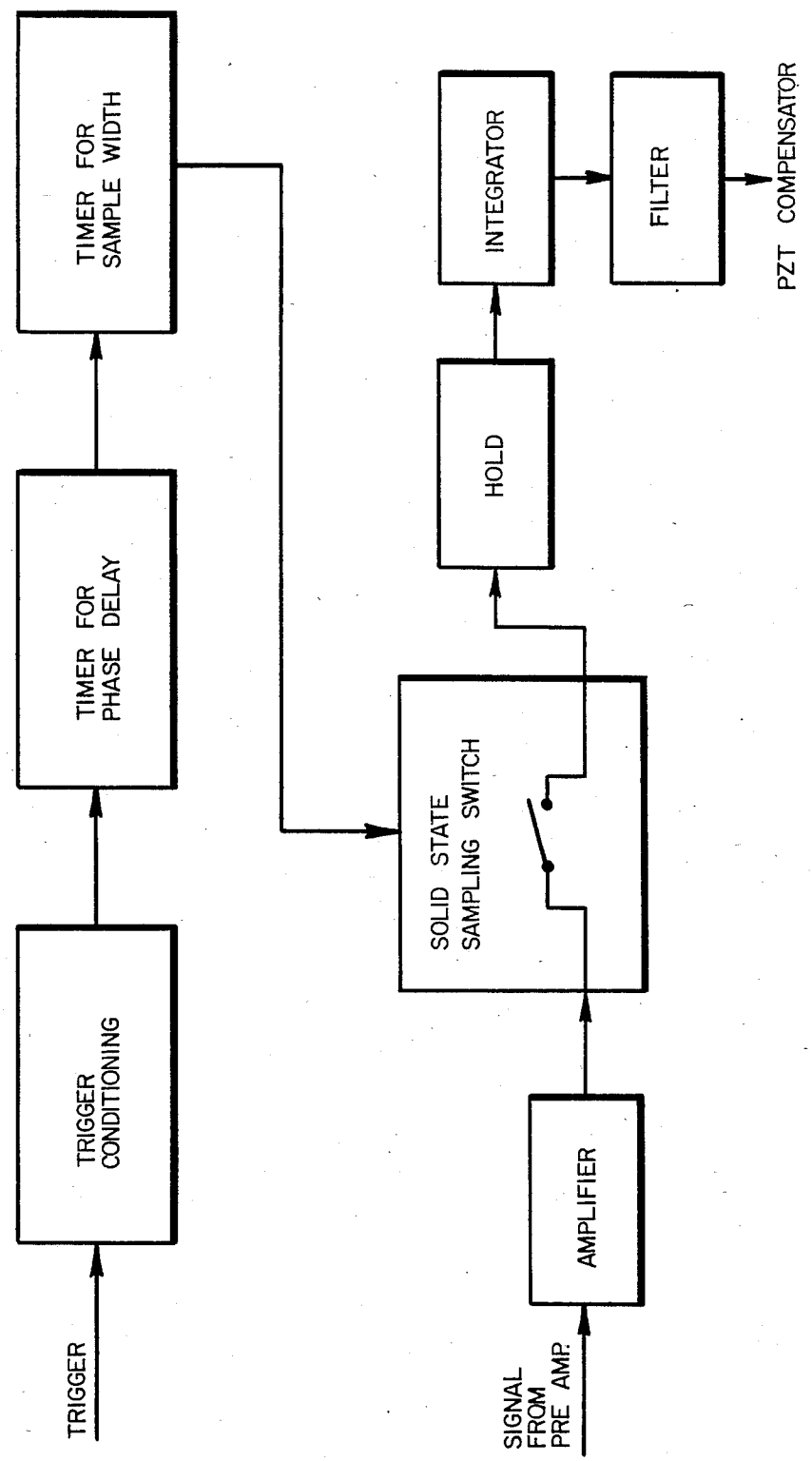
FIG. 6 is a block diagram of the sample and hold feedback controller.

The sample and hold feedback controller 52 is shown in greater detail in FIG. 6. The trigger signal applied on line 54 from the oscillator 28 is applied to a timer 58 through trigger conditioning circuitry 59 which provides an amplified spiked output. The timer 58 is responsive to a positive spiked output from the circuitry 59 to generate an output pulse, the timer being adjustable to delay the output pulse so that it occurs at the turning point $\omega t=0$. The pulse from the timer 58 is coupled to a sample width control timer 60 which adjusts the duration of the pulse to approximately 20 μsec. The sample pulse output from the timer 60 is applied to a solid state sampling switch 62 which closes in response thereto.

The output of the magnetometer at the preamplifier 56 is coupled to the solid state sampling switch 62 through a gain control amplifier 64. The amplified magnetometer output is passed to a hold circuit 66 through the sampling switch 62 which is closed for the duration of the 20 μsec pulse from the sample width control timer. The output of the hold circuit 66 is integrated by an integrator 68 and applied to a pi-filter 70 having the same time constant as the integrator which is approximately equal to the sample period. The voltage output of the pi-filter is applied to the PZT compensator 36 which operates in response thereto to hold $L\alpha$(Temp) to a fixed value of $\pi/2$ at the sampled turning point, $\omega t=0$, such that $V_{out}(0)=0$.

Figure 7:
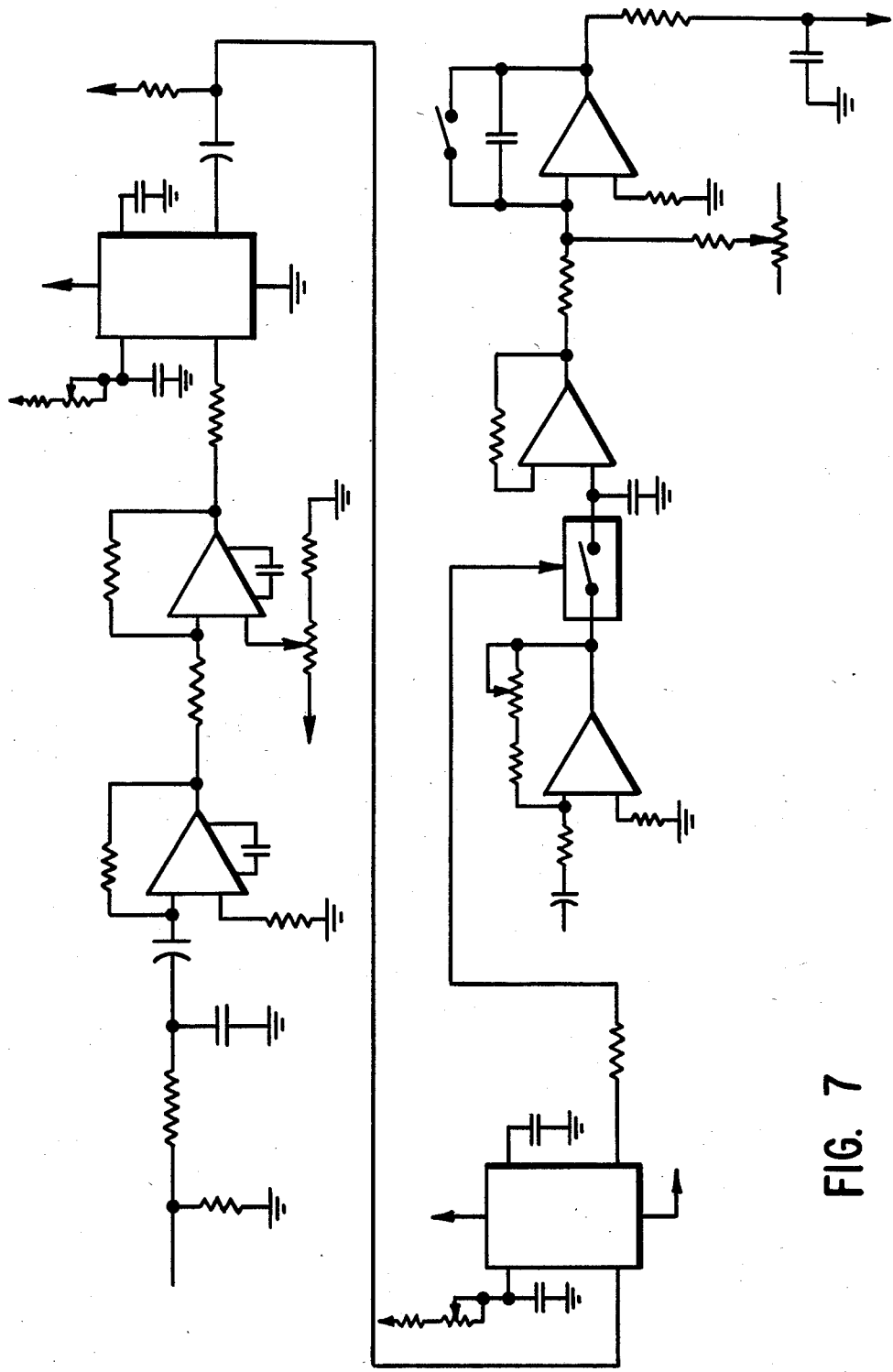
FIG. 7 is a schematic diagram of the sample and hold feedback controller.

The sample and hold feedback controller 52 is shown in still greater detail in FIG. 7. The trigger conditioning circuitry 59, to which the square wave trigger from the oscillator on line 54 is applied, includes two op amps 72 and 74. The trigger is applied to the op amp 72 through a filter comprised of a resistor 76 connected to ground through a capacitor 78, the resistor 76 also being connected to ground through a resistor 80. The op amp 72 has its inverting input terminal connected to a capacitor 82 and has a resistor 84 connected in a feedback path between the output of the op amp and the inverting input terminal thereof to form a differentiator, the noninverting input terminal of the op amp being connected to ground through a resistor 86. The op amp 72 differentiates the square wave trigger applied on line 54 to produce positive and negative going spikes in response to the rising and falling edges of the square wave. The spiked output of the op amp 72 is applied to the inverting input terminal of the op amp 74 through a resistor 88. The op amp 74 includes a resistor 90 connected in a feedback path between the output of the op amp and the inverting input terminal thereof. The noninverting input terminal of the op amp is connected to a variable resistor 92 which is connected to +15 volts and to ground through a resistor 94. The amplified spiked output of the op amp 74 is applied to the phase delay timer 58 through a resistor 98, the timer being triggered by the positive going spike.

The phase delay timer 58, in response to the positive going spike from the amplifier 74, produces a pulse which is output on a line 101. The timer 58 includes an input terminal connected to +15 volts through a resistor 100 and a variable resistor 102 which in turn is connected to ground through a capacitor 104. The variable resistor 102 is adjusted such that the output pulse on line 101 occurs at the turning point $\omega t=0$. The pulse on line 101 is differentiated by a capacitor 106 connected to +15 volts through a resistor 108 to produce a positive and a negative spiked output on line 109. The positive spike on line 109 triggers the sample width control timer 60 to provide the sample pulse. The sample width control timer 60 includes an input terminal coupled to +15 volts through a resistor 111 connected in series to a variable resistor 110 which in turn is connected to ground through a capacitor 112, the variable resistor 110 being adjustable to control the duration of the sample pulse output from the timer 60 on line 113. The sample pulse is connected to the solid state sampling switch 62 through a resistor 114 to close the switch during the duration of the pulse.

The output from the magnetometer at the preamplifier 56 is coupled to the gain control amplifier 64 through a capacitor 116 so that D.C. drift of the light level does not unlock the system. The capacitor 116 is connected to the inverting input terminal of the amplifier 64 through a resistor 118, the output of the amplifier being connected to the inverting input terminal thereof through a variable resistor 119 and a series connected resistor 120. The variable resistor 119 is adjustable to provide gain control for the sample and hold controller. The amplified magnetometer output is applied to the solid state sampling switch 62 and is passed to the hold circuit 66 during the duration of the sample pulse from the timer 60. The hold circuit 66 includes an op amp 121 having a noninverting input terminal connected to the sampling switch 62 and to ground through a capacitor 124, a resistor 122 being connected in a feedback path between the output of the op amp 21 and the inverting input terminal thereof. The voltage held across the capacitor 124 is applied to the integrator 68 through a resistor 126. The resistor 126 is connected to a variable resistor 128 through a resistor 130, the variable resistor being connected between +15 and −15 volts. The integrator 68 includes an op amp 132 having a capacitor 134 connected in a feedback path. The integrator also includes a manual reset switch 136 connected across the capacitor 134. The manual reset switch may be replaced by an automatic reset for the integrator as is well-known in the art. The integrated output of the op amp 132 is applied to the pi-filter 70 which is comprised of a 4.7 K ohm resistor connected to ground through a 1.0 μf capacitor 142. The output of the pi-filter on a line 144 is applied to the PZT compensator 36 to hold the output of the magnetometer $V_{out}(\omega t)$ to zero at the sampled turning point $\omega t=0$.

Three techniques may be used at block 57 to analyze the output of the magnetometer for the unknown magnetic fields $H_x$. One technique is to provide a lock-in amplifier such as shown at 42 in FIG. 1, the lock-in amplifier receiving the output of the pre-amplifier 56 and being locked in frequency and phase by the trigger signal on line 54 from the oscillator 28 to pass a signal on line 150 which is proportional to the fundamental frequency of the magnetometer output and, in the first approximation, proportional to the unknown ambient magnetic field $H_x$. A second technique is to provide a lock-in amplifier on a higher order harmonic which may be more sensitive to $H_x$. To implement this technique an adjustable frequency multiplier is coupled between the oscillator 28 and the lock-in amplifier, the multiplier receiving the trigger signal and altering the frequency thereof to provide an output coupled to the lock-in amplifier to lock in on the higher order harmonic.

Figure 8:
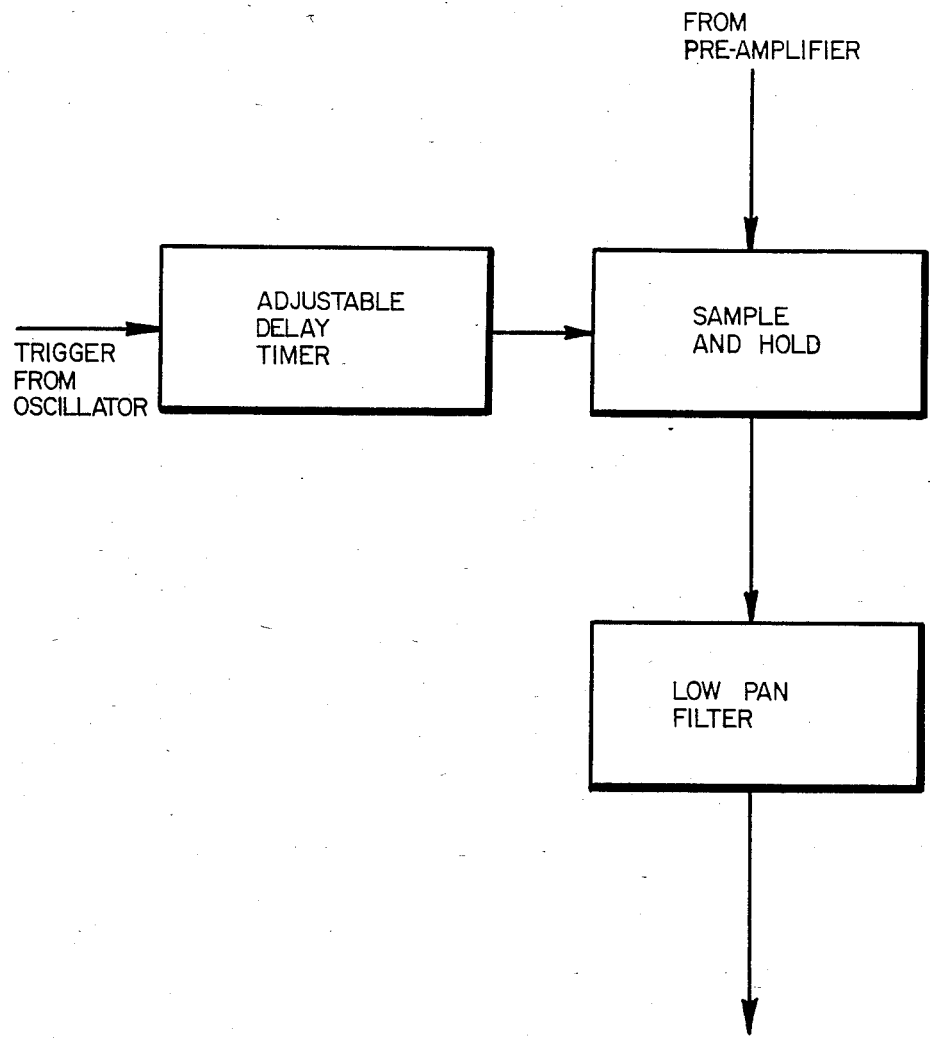
FIG. 8 is a block diagram of a signal analysis technique for the optical fiber magnetometer of FIG. 4.

A third technique, in which the magnetometer output is sampled at key points, is shown in FIG. 8. The trigger signal from the oscillator 28 is delayed by a timer 152 to provide a sample pulse which occurs at any of the remaining turning points $\omega t=\pi/2, \pi, 3\pi/2 \ldots$. The sample pulse is applied to a sample and hold circuit 154 which samples the magnetometer output at the selected turning point. As discussed above, while the magnetometer output at $\omega t=0$ is always held to zero, the output at the remaining turning points varies with the unknown ambient magnetic field. Thus the magnetometer output at the sampled turning point, i.e., the output of the sample and hold circuit 152, when passed through a low pass filter 156, provides a voltage which is proportional to the unknown magnetic field.

With reference to FIG. 4, an outer feedback controller is provided and includes an integrator 158 to which the output from the signal analysis block 57 is applied. The output of the integrator is amplified by a current amplifier 160 and coupled to a coil 162. The coil 162 is wound about both of the rods 20 and 22 to apply a magnetic field, $-H_x$, thereto which is equal in magnitude to the unknown ambient magnetic field being measured but in the opposite direction thereof. The outer feedback controller enables the magnetometer to operate at high sensitivity, with a higher dynamic range.

I claim:

1. In a magnetometer having an optical fiber interferometer with first and second arms and a laser beam input coupled to said interferometer for travel through each of said arms, a system for measuring a D.C. to a low frequency ambient magnetic field comprising:
    a pair of matched magnetostrictive elements, each of said elements being coupled to a different arm of said interferometer;
    means for applying a bias magnetic field to each of said magnetostrictive elements 180° out of phase to provide balanced oscillations; and
    means for comparing the laser beam outputs of each of said interferometer arms to develop a signal representative of the ambient magnetic field.

2. The magnetometer of claim 1 wherein said signal developed by the comparing means includes a component, the intensity of which is proportional to the low frequency magnetic field and a component which is proportional to the unbalance of the system and further including means for eliminating the unbalance component from said signal.

3. The magnetometer of claim 1 wherein each of said magnetostrictive elements are coupled to an equal length of optical fiber in each of said interferometer arms.

4. The magnetometer of claim 3 wherein the length of optical fiber to which each of the magnetostrictive elements is coupled is at least 4 meters.

5. The magnetometer of claim 1 wherein said magnetostrictive elements are made of nickel.

6. The magnetometer of claim 1 wherein said magnetostrictive elements are made of a metallic glass.

7. The magnetometer of claim 1 wherein said magnetostrictive elements are made of a rare earth material.

8. The magnetometer of claim 1 wherein each of said magnetostrictive elements is a hollow rod.

9. The magnetometer of claim 1 wherein each of said magnetostrictive elements is a rod with the optical fiber of each interferometer arm being secured to the outer surface of the rod.

10. The magnetometer of claim 1 wherein each of said magnetostrictive elements is a rod having a diameter of at least one inch wherein the optical fiber of each interferometer arm is wound about the circumference of the respective magnetostrictive rod to which it is coupled.

11. In a magnetometer having an optical fiber interferometer with first and second arms and a laser beam input coupled to said interferometer for travel through each of said arms, a system for measuring a D.C. to a low frequency ambient magnetic field comprising:
    a first magnetostrictive element being coupled to a length of the optical fiber in said first interferometer arm;
    a second magnetostrictive element being coupled to a length of the optical fiber in said second interferometer arm;
    means for driving said first and second rods 180° out of phase to apply respective oscillating bias magnetic fields to each of said rods, the ambient magnetic field providing an offset which is combined which each of said oscillating bias magnetic fields to induce a change in path length of each of said interferometer arms;
    means responsive to the output of said interferometer for developing a signal representative of the difference in the change in path length of each of said interferometer arms; and means responsive to the difference signal for providing an output signal, the intensity of which is proportional to the ambient magnetic field.

12. The magnetometer of claim 11 wherein said difference signal includes components which are proportional to the unbalance of the system and said means for providing the output signal includes means for eliminating said unbalance components.

13. The magnetometer of claim 12 wherein said driving means provides a reference signal and said eliminating means includes an amplifier locked in frequency and in phase to said reference signal.

14. The magnetometer of claim 11 wherein said means for providing the output signal includes a bandpass filter for eliminating low frequency components from the difference signal due to temperature changes in the optical fibers.

15. The magnetometer of claim 11 wherein said means for developing the difference signal includes:
a light detector responsive to the output of said interferometer to form an interference pattern, the output of said light detector being in terms of the light in the interference pattern and nonlinear; and
means responsive to the output of the light detector for providing a signal which is linear in the difference in the change in path length of each of the interferometer arms.

16. The magnetometer of claim 15 wherein the means for providing a linear signal includes
a continuous null feedback controller; and
compensation means responsive to the output of the feedback controller for changing the path length of one of said interferometer arms.

17. The magnetometer of claim 16 wherein said means for changing the path length includes a piezoelectric transducer having the optical fiber of said one of said interferometer arms coupled thereto.

18. The magnetometer of claim 11 further including means for modulating the path length of one of said interferometer arms in response to said means for developing said difference signal to maintain the interferometer arms balanced.

19. In a magnetometer having an optical fiber interferometer with first and second arms and a laser beam input coupled to said interferometer for travel through each of said arms, a gradiometer for measuring the gradient between first and second low frequency magnetic fields comprising:
first and second magnetostrictive elements forming a first matched pair, each of said first and second elements being coupled to a different arm of said interferometer and responsive to said first low frequency magnetic field;
third and fourth magnetostrictive elements forming a second matched pair, each of said third and fourth elements being coupled to a different arm of said interferometer and responsive to said second low frequency magnetic field;
means for applying a bias magnetic field to each of said magnetostrictive elements wherein the bias field applied to said second element is 180° out of phase with said first element, the bias field applied to said fourth element is 180° out of phase with said third element and the bias field applied to said third element is 180° out of phase with said first element; and
means for comparing the laser beam outputs of each of said interferometer arms to develop a signal representative of the gradient between said first and second low frequency magnetic fields.

20. The magnetometer of claim 19 wherein said first and third magnetostrictive elements are coupled to the optical fiber of the first interferometer arm, and separated by a distance and said second and fourth magnetostrictive elements are coupled to the optical fiber of the second interferometer arm and separated by an equal distance.

21. The magnetometer of claim 19 wherein said signal developed by the comparing means includes a component, the intensity of which is proportional to the gradient and a component which is proportional to the unbalance of the system and further including means for eliminating the unbalance component from said signal.

22. In a magnetometer having an optical fiber interferometer with first and second arms and a laser beam input coupled to said interferometer for travel through each of said arms, a system for measuring a D.C. to a low frequency ambient magnetic field comprising:
a pair of matched magnetostrictive elements, each of said elements being coupled to a different arm of said interferometer;
means for driving said pair of elements 180° out of phase to apply respective oscillating bias magnetic fields to each of said elements, the ambient magnetic field providing an offset which is combined with each of said oscillating bias magnetic fields to induce a change in path length of each of said interferometer arms;
means responsive to the output of said interferometer for developing a signal which varies as a function of the changes in path length due to said magnetic fields and due to temperature fluctuations;
means responsive to said signal for holding the changes in path length due to temperature to a fixed value to prevent said signal from drifting with temperature; and
means responsive to said signal for providing an output proportional to the ambient magnetic field.

23. The magnetometer of claim 22 wherein said holding means includes:
a sample and hold feedback controller; and
compensation means coupled to one arm of said interferometer and responsive to the output of said feedback controller for changing the path length of said one interferometer arm.

24. The magnetometer of claim 22 wherein said holding means includes:
means for sampling said signal at a predetermined period of time with respect to the output of said driving means to derive a temperature compensation signal; and
means responsive to said temperature compensation signal for changing the path length of an arm of said interferometer to hold the change in path length due to temperature to a fixed value.

25. The magnetometer of claim 24 wherein said drive means generates a periodic drive signal having a plurality of turning points therein,
said sampling means sampling said signal at a selected turning point of said drive to derive the temperature compensation signal, the path length changing means being responsive to said temperature compensation signal to hold the change in path length due to temperature to a fixed value such that said signal is held to a relative zero value at the selected turning point.

26. The magnetometer of claim 25 wherein said signal, at the turning points other than said selected turning point, varies with said ambient magnetic field and said output providing means includes means for sampling said signal at one of said other turning points.

* * * * *